(12) United States Patent
Orlowski et al.

(10) Patent No.: US 7,442,621 B2
(45) Date of Patent: Oct. 28, 2008

(54) SEMICONDUCTOR PROCESS FOR FORMING STRESS ABSORBENT SHALLOW TRENCH ISOLATION STRUCTURES

(75) Inventors: Marius K. Orlowski, Austin, TX (US); Mark C. Foisy, Austin, TX (US); Olubunmi O. Adetutu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 322 days.

(21) Appl. No.: 10/996,319

(22) Filed: Nov. 22, 2004

(65) Prior Publication Data
US 2006/0110892 A1    May 25, 2006

(51) Int. Cl.
*H01L 21/76* (2006.01)
(52) U.S. Cl. ............ 438/436; 438/435; 257/E21.546
(58) Field of Classification Search ......... 438/435, 438/436; 257/E21.546
See application file for complete search history.

(56) References Cited

U.S. PATENT DOCUMENTS

| 6,621,131 | B2 | 9/2003 | Murthy et al. | |
|---|---|---|---|---|
| 2004/0029375 | A1* | 2/2004 | Lee et al. | 438/626 |
| 2004/0192009 | A1* | 9/2004 | Belyansky et al. | 438/424 |
| 2005/0095872 | A1* | 5/2005 | Belyansky et al. | 438/778 |

OTHER PUBLICATIONS

Yin, H. et al.; Strain relaxation of SiGe islands on compliant oxide, J. Appl. Phys. 91(12), 9716, 2002.
Chung, Sung-Woong et al.; Novel shallow trench isolation process using flowable oxide CVD for sub-100nm DRAM, IEDM p. 233, IEEE 2002.
Huang, R. et al.; Relaxation of a strained elastic film on a viscous layer, Mat. Res. Soc. Symp. vol. 695, p. L3.14.1, 2002.
Yin, H. et al.; Strain partition of Si/SiGe and SiO2/SiGe on compliant substrates, Appl. Phys. Lett. 82(22), 3853, 2003.

* cited by examiner

*Primary Examiner*—Bradley K Smith
(74) *Attorney, Agent, or Firm*—James L. Clingan, Jr.; Ranjeev Singh

(57) ABSTRACT

A semiconductor fabrication process includes patterning a hard mask over a semiconductor substrate to expose an isolation region and forming a trench in the isolation region. A flowable dielectric is deposited in the trench to partially fill the trench and a capping dielectric is deposited overlying the first oxide to fill the trench. The substrate may be a silicon on insulator (SOI) substrate including a buried oxide (BOX) layer and the trench may extend partially into the BOX layer. The flowable dielectric may be a spin deposited flowable oxide or a CVD BPSG oxide. The flowable dielectric isolation structure provides a buffer that prevents stress induced on one side of the isolation structure from creating stress on the other side of the structure. Thus, for example, compressive stress created by forming silicon germanium on silicon in PMOS regions does not create compressive stress in NMOS regions.

15 Claims, 3 Drawing Sheets

US 7,442,621 B2

SEMICONDUCTOR PROCESS FOR FORMING STRESS ABSORBENT SHALLOW TRENCH ISOLATION STRUCTURES

FIELD OF THE INVENTION

The present invention is in the field of semiconductor fabrication processes and, more particularly, isolation structures for semiconductor fabrication processes.

RELATED ART

In the field of semiconductor fabrication processes, carrier mobility enhancement techniques involving the intentional introduction of compressive or tensile stress (or both) within the active transistor areas have been proposed. The use of compressively stressed silicon germanium, for example, has been proposed to enhance hole mobility for PMOS transistors. Because these techniques are typically being proposed for use in advanced semiconductor fabrication processes in which adjacent devices are closely spaced, it is possible that region of the wafer exhibiting a first type of stress characteristic will be in close proximity to a region of the wafer exhibiting a second type of stress characteristic such as when a compressively stressed PMOS transistor and a tensily stressed NMOS transistor are separated by an isolation trench having a minimum dimension. In such cases, it is possible that the stress characteristics of the first region may transfer, through the isolation structure, to the second region of the wafer where the stress characteristics may have a negative impact on device performance. It would be desirable, therefore, to implement a fabrication processes that uses stressed active regions to enhance carrier mobility of a first type of transistor while ensuring that the stressed regions do not adversely affect adjacent transistors.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the invention is directed at a semiconductor fabrication process that employs trench isolation structures designed to reduce or eliminate stress created at one transistor from being undesirably transmitted to an adjacent transistor through the isolation structure. Isolation trenches according to the present invention are primarily filled with a flowable type of oxide that acts as a damping structure that prevents compressive or tensile stress in one transistor being transmitted to an adjacent transistor. The isolation trenches are preferably capped with a second dielectric. The second dielectric has better mechanical stability and density than the first dielectric. The isolation trenches may incorporate trench liners to prevent unwanted diffusion of impurities in the trench to the active device areas.

Figure 1:
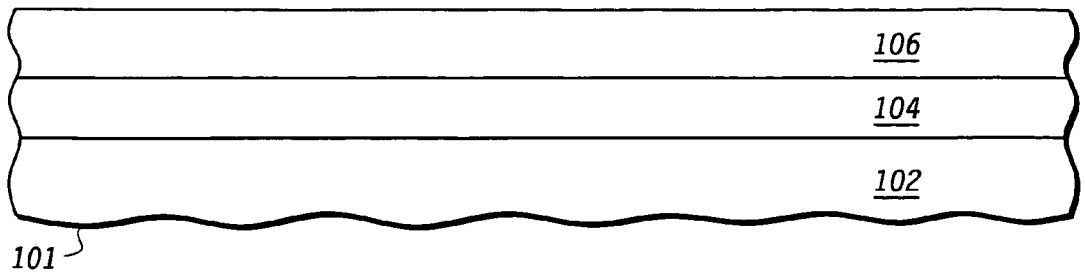
FIG. 1 is a partial cross sectional view of a semiconductor wafer substrate at a selected stage in an integrated circuit fabrication process according to one embodiment of the present invention.

Referring now to the drawings, FIG. 1 is a partial cross sectional view of a semiconductor wafer 101 suitable for use in the fabrication of integrated circuits. In the depicted embodiment wafer 101 is a silicon on insulator (SOI) wafer. In this embodiment, wafer 101 includes a bulk 102 that is typically made of lightly doped, single crystal silicon. In other implementations, bulk 102 may be another semiconductor material such as gallium arsenide or another III-V compound.

An oxide layer, referred to as buried oxide (BOX) layer 104 overlies that wafer bulk 102. A semiconductor layer, referred to herein as active layer 106 overlies BOX layer 104. Active layer 106 may include various semiconductor materials including n-doped or p-doped silicon, silicon germanium, or silicon carbon. In other implementations, the starting material for wafer 101 is a conventional or "bulk" wafer that does not have a BOX layer.

Figure 2:
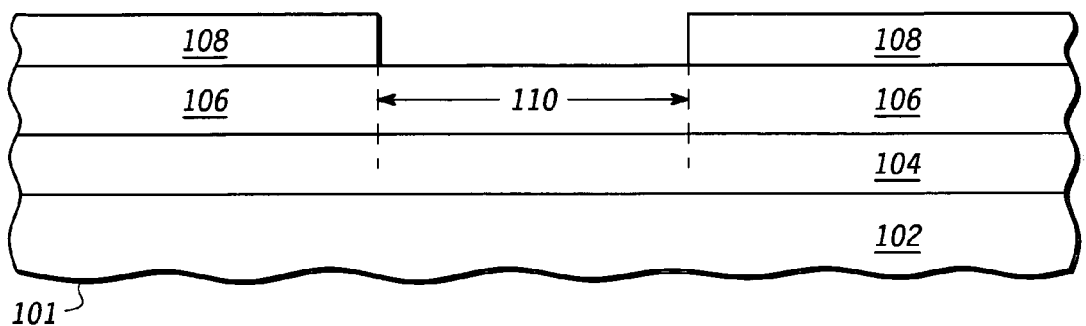
FIG. 2 depicts processing subsequent to the processing shown in FIG. 1 in which a mask is patterned over the substrate.

Referring now to FIG. 2, a patterned mask 108 is formed over active layer 106 of wafer 101. Mask 108 is patterned to expose an isolation region denoted by reference numeral 110 in wafer 101. Isolation regions 110 represent regions of wafer 101 that provide physical and electrical separation and isolation between adjacent transistors. In one implementation, mask 108 is a hard mask (as opposed to a photoresist mask) made of a material such as silicon nitride. In this implementation, a pad oxide (not shown) may be formed on an upper surface of wafer 101 prior to depositing the silicon nitride for mask 108. Patterning of mask 108 is achieved using conventional photoresist and photolithographic processes.

Figure 3:
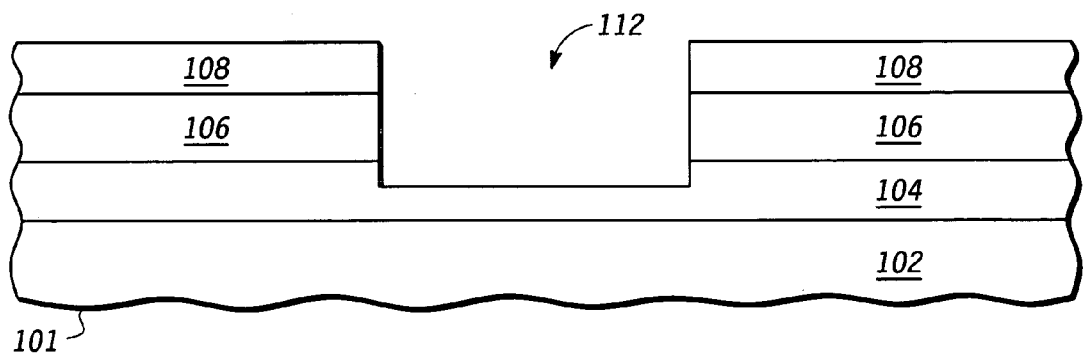
FIG. 3 depicts processing subsequent to the processing shown in FIG. 2 in which a trench is formed in the substrate.

Referring now to FIG. 3, an isolation trench 112 is formed in wafer 101 by removing portions of active layer 104 within isolation regions 110 defined by patterned mask 108. The trench isolation etch used to form isolation trench may be a conventional silicon plasma etch process that is selective to silicon nitride. In an embodiment suitable for implementations that use an SOI starting material (such as the wafer 101 depicted in FIG. 1), the isolation trench 112 extends entirely through the active layer 106 and partially into the BOX layer 106. Other implementations may form an isolation trench that extends entirely through both active layer 106 and BOX layer 104.

Figure 4:
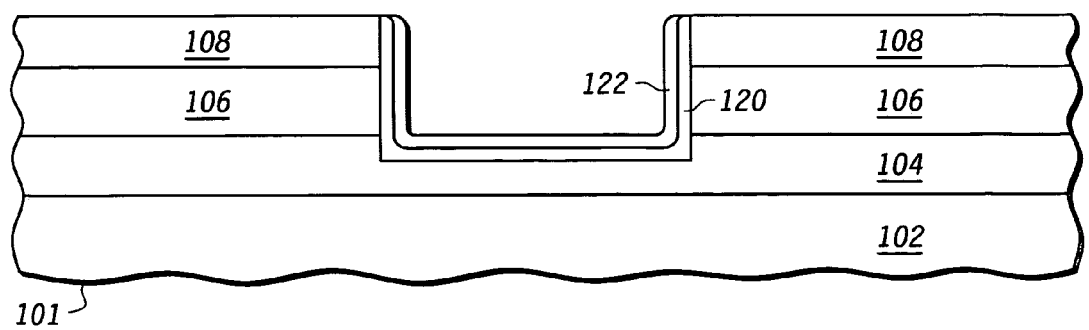
FIG. 4 depicts processing subsequent to the processing shown in FIG. 3 in which dielectric liners are formed on the trench.

Turning now to FIG. 4, one or more dielectric liners are formed on sidewalls and the bottom or floor of isolation trench 112. In the depicted embodiment, a silicon oxide liner 120 is formed adjacent the sidewalls of isolation trench 112 and a silicon nitride liner 122 is formed adjacent to silicon oxide liner 120. The use of silicon nitride liner 122 beneficially provides a barrier to mobile contaminants or impurities that may be present in a subsequent formed isolation trench structure.

Figure 5:
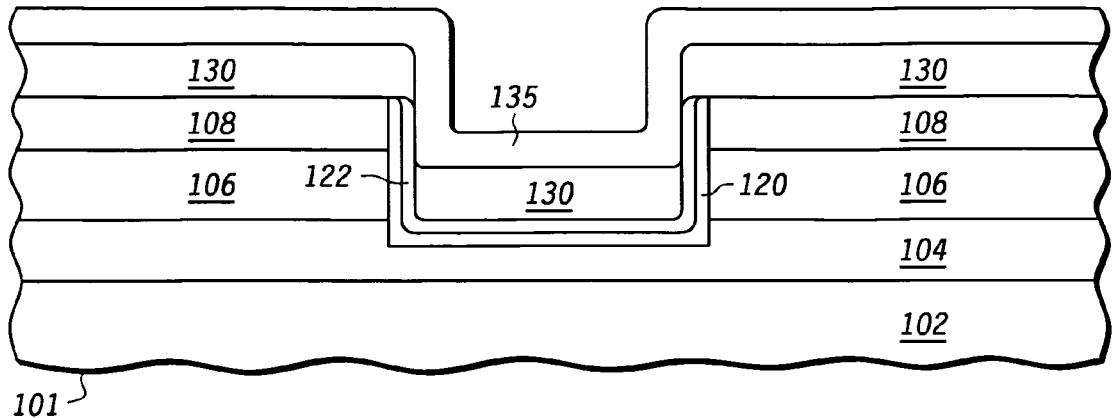
FIG. 5 depicts processing subsequent to the processing shown in FIG. 4 in which a first dielectric and a capping dielectric are deposited over the wafer.

Turning now to FIG. 5, a first dielectric film 130 is deposited over wafer 101 and second dielectric film 135 is deposited over the first dielectric film. The first dielectric film 130 is referred to herein as flowable dielectric film 130. A flowable dielectric film, for purposes of this disclosure, is a dielectric film that flows at a temperature of less than approximately 900 C. Flowable dielectric 130 may be implemented in various different embodiments. In one embodiment, flowable dielectric 130 is a commercially distributed, flowable oxide available from Dupont. In this embodiment, flowable oxide 130 is a spin on, low dielectric constant material that is flowable at a temperature of less than approximately 300 C.

In other embodiments, flowable dielectric 130 is doped glass such as borophosphosilicate glass (BPSG) preferably having a boron and phosphorous content of approximately 4% by weight or more. In this embodiment, the BPSG film will flow at a temperature of approximately 900 C. or less. In other doped glass embodiments, flowable dielectric 130 may be implemented as a phosphosilicate glass (PSG) or a borosilicate glass (BSG). In any of these doped glass embodiments, flowable silicon oxide 130 may be formed using widely known doped glass deposition techniques. In still other embodiments, flowable oxide 130 may be formed by depositing a conventional TEOS or other suitable silicon oxide material and introducing the desired level of impurities such as boron and/or phosphorous through ion implantation.

Flowable dielectric 130 as shown in FIG. 5 only partially fills dielectric trench 112. This embodiment is desirable for implementations that incorporate a capping layer overlying the flowable dielectric. Although flowable dielectric 112 has desirable flow properties, it may have undesirably high porosity or other characteristics that would counsel in favor of capping the flowable dielectric with a material that is more moisture impervious. To facilitate the partial filling of isolation trench 112 with flowable dielectric 130, the process parameters for the deposition of flowable dielectric 130 may be controlled to produce a deposition that exhibits intentionally poor step coverage as suggested by the flowable dielectric depicted in FIG. 5. In this embodiment, little dielectric is formed on the sidewalls of dielectric trench 112 and, by controlling the thickness of the dielectric film deposited, flowable dielectric 130 only partially fills dielectric trench 112.

The capping dielectric 135 is preferably a dielectric that exhibits excellent thermal and mechanical stability and is highly impervious to moisture. In the preferred embodiment, capping dielectric 135 is a high density plasma (HDP) silicon oxide. An HDP silicon oxide, as suggested by its name, is chemically vapor deposited using a low pressure, high density plasma. For purposes of this disclosure, a high density plasma is a plasma having an ion density of greater than approximately $10^{10}$ ions/cm$^3$. The high density plasma produces a silicon oxide having the desired mechanical and barrier properties at a temperature of approximately 400 C. or lower. The thickness of capping dielectric 135 is sufficient to fill and, preferably, overfill the isolation trench so that the upper surface of capping dielectric 135 is above the upper surface of active layer 106 of wafer 101.

Figure 6:
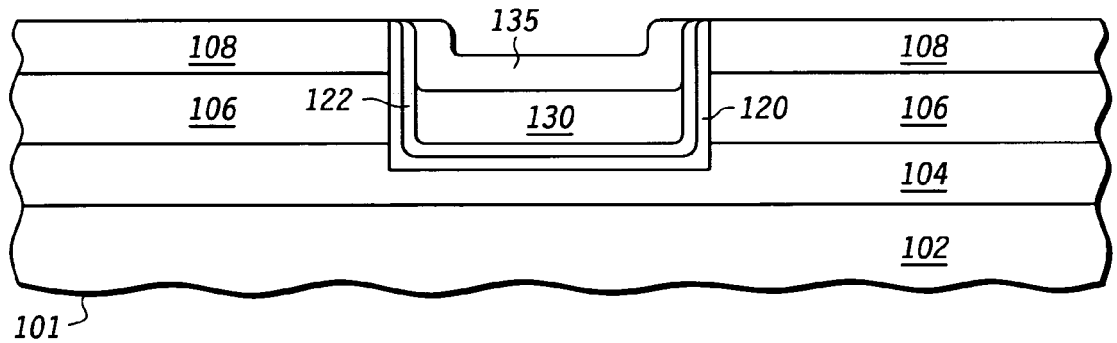
FIG. 6 depicts processing subsequent to the processing shown in FIG. 5 in which the deposited layers are polished back.

Turning now to FIG. 6, portions of capping dielectric 135 and flowable dielectric 130 that are exterior to the isolation trench are removed. In one embodiment, a chemical mechanical polish (CMP) process is used to remove dielectric layers 130 and 135 with mask 108 being used as a polish stop. The CMP process may also remove portions of patterned mask 108, but preferably leaves at least a portion of patterned mask 108 intact.

Figure 7:
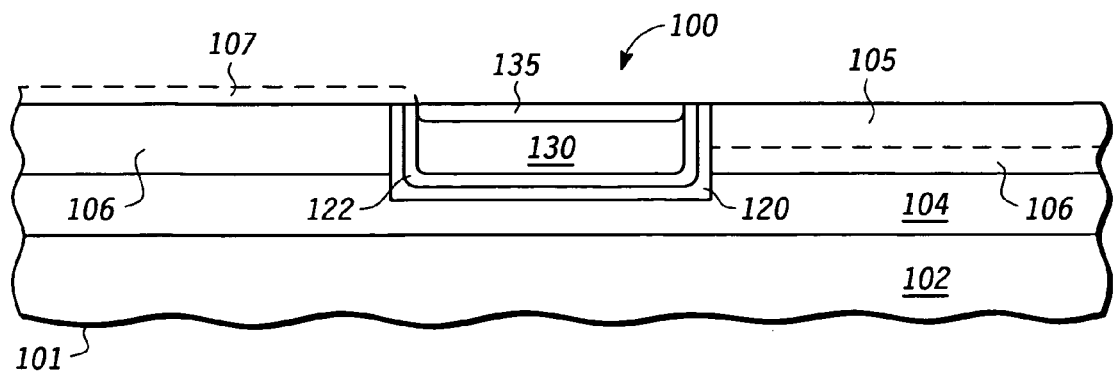
FIG. 7 depicts processing subsequent to the processing shown in FIG. 6 in which the mask is removed and a stress absorbing isolation trench results.

As shown in FIG. 7, remaining portions of patterned mask 108 are removed. In the preferred embodiment, patterned mask 108 is removed with a wet or dry etch process that is preferential to patterned mask 108 and selective to capping dielectric 135. Embodiments that use a silicon nitride mask 108 and a silicon oxide capping dielectric 135, for example, may use a hot phosphoric acid wet etch process or various dry etch processes including NF$_3$. An additional polish may be performed as well to obtain a smooth upper surface.

In addition to the removal of patterned mask 108, FIG. 7 depicts a region 105 where a first portion of semiconductor layer 106 was shown in FIG. 6 and a region 107 where a second portion of semiconductor layer 106 was shown in FIG. 6. Depending upon the implementation, region 105 may be comprised of the same material as active layer 106 of FIG. 6 or, alternatively, region 105 may be comprised of a different material than the material of active layer 106. Similarly, region 107 may be comprised of the same material as semiconductor layer 106 or a different material. Moreover, the material in region 105 and region 107 may also differ.

One example of a process that produces a region 105 having a material that differs from active layer 106 is a source/drain refill process. In a source/drain refill process, a significant portion of at least some regions (e.g., PMOS regions) of active layer 106 are etched or otherwise removed. The resulting void is then filled, usually with an epitaxial process, with a semiconductor material having a different lattice constant that the lattice constant of active layer 106. If active layer 106 is silicon, for example, region 105 may be comprised of silicon germanium or silicon carbide. When the material in region 105 and/or 107 has a lattice constant that is different than the material of active layer 106, compressive or tensile stress results.

Another example of a stress producing process includes the deposition of a material on the active layer 106 where the deposited material has a different lattice constant than active layer 106. For example, region 107 might represent a film such as silicon nitride deposited overlying active layer 106. Silicon nitride can create either compressive or tensile stress depending upon the deposition parameters and the impurities introduced in the silicon nitride film.

Stress, when properly restricted to appropriate regions of the wafer, advantageously enhances carrier mobility resulting in better performing transistors. Isolation structure 100 beneficially prevents transmission of stress from one region of the wafer to another region. The isolation structure 100 depicted in FIG. 7 includes a first and relatively flowable dielectric 130 within an isolation trench formed in the substrate and a capping dielectric 135 overlying the flowable dielectric. The depicted embodiment of dielectric structure 100 further includes an oxide liner 120 and a silicon nitride liner 122 formed on sidewalls of the trench. Trench isolation structure 100 as depicted in FIG. 7 extends through an active semiconductor layer 106 of an SOI wafer and partially into the underlying BOX layer 104.

The use of flowable dielectric 130 within isolation structure 100 creates a stress absorbing structure that is able to prevent the transfer of stress from first region 105 of wafer 101, which is adjacent to a first side of trench isolation structure 100, to second region 107 of wafer 101, which is adjacent to a second side of trench isolation structure 100. This stress absorbing characteristic is most beneficial when the stress within first region 105 differs from the stress within second region 107. Although the depicted implementation shows region 107 as a relatively thin film deposited overlying the existing active layer 106 and region 105 as a relatively thick film that replaces a substantial portion of active layer 106, other embodiments are possible. For example, regions 105 and 107 may both be relatively thick films that replace substantial portions of active layer 106. Similarly regions 105 and 107 may both be relatively thin films deposited overlying the existing active layer. Finally, other embodiments may omit either region 105 or 107 so that, on one side of trench 100, the original active layer 106 remains intact.

As indicated above, various mobility enhancing applications use materials designed to create compressive or tensile stress within the active layer 106 of wafer 101. A hole mobility application might use silicon germanium in first region 105 of substrate 106 where first region 105 represents a PMOS region of wafer 101 (a region where PMOS transistors are formed). If the separation between adjacent devices of different conductivity types is below a threshold value, the stress created within a PMOS region of wafer 101 might transfer through the isolation structure to an adjacent NMOS region, where the stress would have a negative impact on NMOS carrier mobility, unless the isolation structure exhibits the stress absorbing characteristics of trench isolation structure 100.

Figure 8:
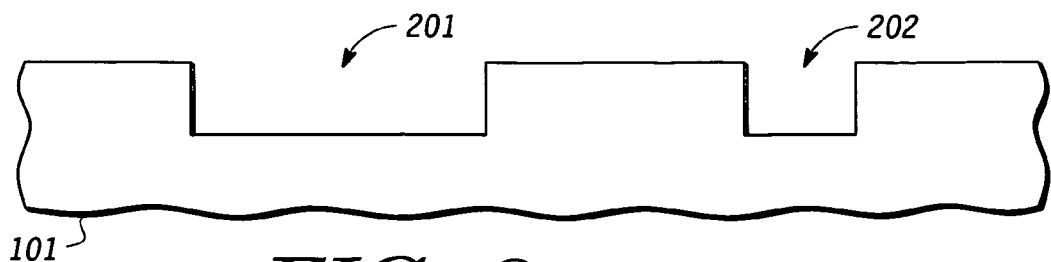
FIG. 8 is a partial cross section view of a wafer in which first and second isolation trenches have been formed.

Referring now to FIG. 8 through FIG. 12, a processing sequence in which a stress absorbing isolation trench formation process, such as the process described above with respect to FIG. 1 through FIG. 7, is integrated into a process that also employs more conventional trench isolation structures. Referring to FIG. 8, first and second isolation trenches 201 and 202 have been formed in wafer 101. The first isolation trench 201 is a relatively wide trench while second isolation trench 202 is relatively narrow. Generally speaking, the stress absorbing characteristics of isolation trench structure 100 described above are needed for narrow isolation trenches (i.e., trenches having a lateral dimension of less than 1000 nm) while conventional trench isolation structures may be preferable for wider isolation structures. It is known that conventional shallow trench isolation exerts a compressive stress on the enclosed active area. The compressive stress in the longitudinal direction is advantageous to PMOS transistor but detrimental to NMOS. Therefore, it might be desirable to isolate the NMOS active area with shallow trench isolation exhibiting the reflowable oxide fill and thus provide relief to the longitudinal compressive stress component.

Figure 9:
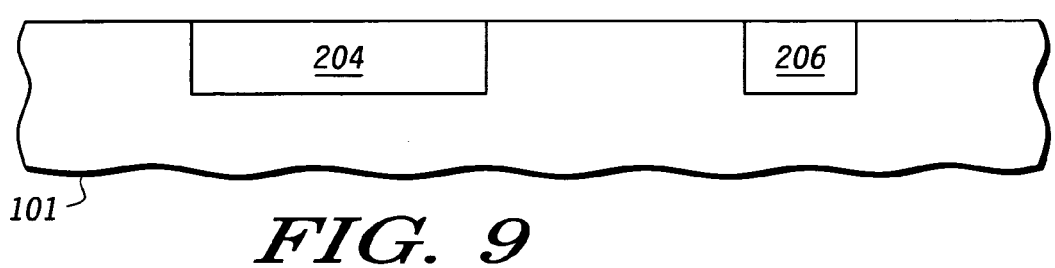
FIG. 9 depicts processing subsequent to the processing depicted in FIG. 8 in which the isolation trenches are filled with a conventional isolation dielectric.
Figure 10:
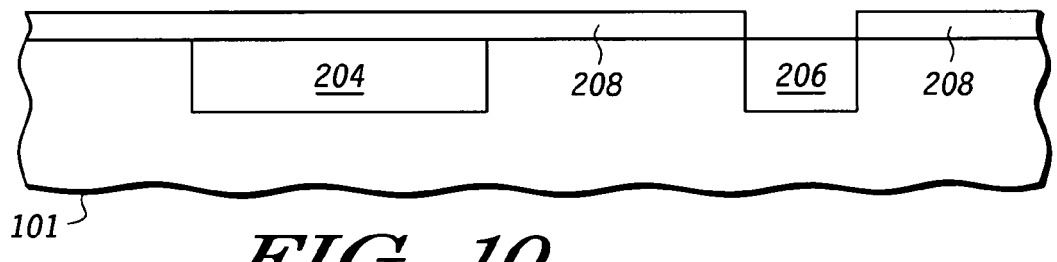
FIG. 10 depicts processing subsequent to the processing depicted in FIG. 9 in which a mask is formed over the wafer to expose the second isolation trench.
Figure 11:
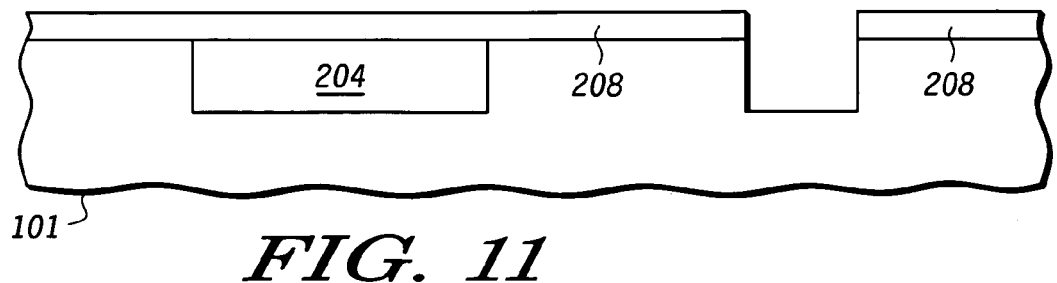
FIG. 11 depicts processing subsequent to the processing depicted in FIG. 10 in which the conventional dielectric is removed from the second isolation trench.
Figure 12:
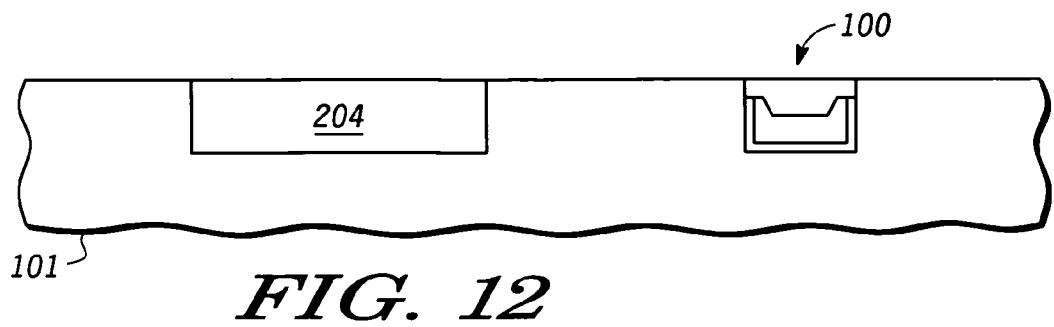
FIG. 12 depicts processing subsequent to the processing depicted in FIG. 11 in which a stress absorbing isolation trench is formed in the second trench.

In FIG. 9, first isolation trench 201 and second isolation trench 202 of FIG. 8 have been filled with a conventional trench isolation dielectric (e.g., TEOS) and polished or otherwise planarized to form first and second isolation structures 204 and 206 respectively. In FIG. 10, a patterned mask 208 is formed to expose the second isolation trench 206. In one embodiment, the patterned mask 208 is a hard mask analogous to mask 108 described above while, in other embodiments, patterned mask 208 is a photoresist mask. In the latter case, the dimensions and registration of the mask are not critical. In FIG. 11, the second isolation trench structure 206 of FIG. 10 is removed with an oxide etch that is selective to mask 108. Following removal of the second isolation structure 206, processing analogous to the processing described above with respect to FIG. 1 through FIG. 7 is performed to produce a stress absorbing trench isolation structure 100 in the relative narrow isolation trench and a conventional trench isolation structure 204 in the relatively wide isolation trench.

In the foregoing specification, the invention has been described with reference to specific embodiments. However, the specification and figures are to be regarded in an illustrative rather than a restrictive sense, and modifications of various materials and processing steps are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   patterning a photoresist layer over a semiconductor substrate to expose an isolation region of the substrate, wherein the substrate is a silicon on insulator (SOI) substrate including a buried oxide (BOX) layer overlying a substrate bulk and an active semiconductor active layer overlying the BOX layer;
   forming a trench in the isolation region;
   forming a first dielectric in the trench to partially fill the trench wherein the first dielectric is a flowable dielectric;
   depositing a capping dielectric overlying the first dielectric to create a trench isolation structure;
   forming a material adjacent a first sidewall of the trench to create stress in the substrate adjacent the first sidewall, wherein the trench isolation structure prevents the stress adjacent the first sidewall from causing stress adjacent a second sidewall of the trench; and
   prior to patterning the photoresist layer, forming a hard mask layer overlying the substrate, wherein the hard mask comprises silicon nitride.

2. The method of claim 1, wherein forming the trench comprises forming trench extending through the active layer and partially into the BOX layer.

3. The method of claim 1, wherein forming the first dielectric includes spin depositing a flowable oxide.

4. The method of claim 1, wherein forming the first dielectric includes depositing a BPSG oxide.

5. The method of claim 1, further comprising, prior to forming the first dielectric, forming an oxide liner adjacent the sidewalls of the isolation trench and a silicon nitride liner adjacent the oxide liner.

6. The method of claim 1, wherein forming the capping dielectric comprises depositing a high density plasma oxide overlying the first dielectric.

7. A semiconductor fabrication process, comprising:
   forming a narrow isolation trench in a wafer substrate, wherein a narrow isolation trench has a lateral dimension of less than approximately1 micrometer, wherein the wafer is a silicon on insulator (SOI) wafer, wherein the SQl wafer includes a buried oxide overlying a substrate bulk and a semiconductive active layer overlying the BOX layer and further wherein forming the narrow isolation trench comprises forming a narrow isolation trench extending through the active layer and partially into the BOX layer, partially filling the narrow isolation trench with a first dielectric, the first dielectric having a flow temperature no greater than approximately 900 C.; and forming a capping dielectric overlying the first dielectric using a high density plasma deposition process to fill the narrow isolation trench.

8. The method of claim 7, wherein partially filling the narrow isolation trench with a first dielectric comprises partially filling the narrow isolation trench with a spin-on flowable oxide.

9. The method of claim 7, wherein partially filling the narrow isolation trench with a first dielectric comprises partially filling the narrow isolation trench with borophosphosilicate glass (BPSG).

10. The method of claim 7, wherein partially filling the narrow isolation trench with the first dielectric comprises depositing a TEOS film and implanting the TEOS film with at least one species selected from the group consisting of boron and phosphorous.

11. The method of claim 7, wherein forming the capping dielectric comprises forming the capping dielectric using a plasma having a plasma density in excess of approximately $10^{10}$ ions/cm$^3$.

12. The method of claim 7, further comprising, while forming the narrow isolation trench, forming a wide isolation trench having a lateral dimension of greater than 1 micrometer and, prior to depositing the first dielectric in the narrow isolation trench:

depositing an isolation dielectric in the narrow and wide isolation trench;

patterning a mask overlying the wafer to expose the narrow isolation trench; and removing the isolation dielectric from the narrow isolation trench.

13. An isolation structure suitable for use in an integrated circuit, comprising:

a flowable dielectric partially filling an isolation trench formed in a semiconductor substrate, wherein the semiconductor substrate comprises a semiconductor active layer overlying a buried oxide (BOX) layer overlying a substrate bulk, and wherein the isolation trench extends through the active semiconductor layer and partially into the BOX layer; and a capping dielectric overlying the flowable dielectric.

14. The isolation structure of claim 13, wherein the semiconductor substrate adjacent a first side of the isolation trench exhibits compressive stress and wherein the substrate adjacent a second side of the isolation trench exhibits tensile stress.

15. The isolation structure of claim 13, wherein the flowable dielectric is selected from a group consisting of borophosphosilicate (BPSG) glass and spin-on flowable oxide and wherein the capping dielectric is a high density oxide and further comprising a silicon nitride liner intermediate between the flowable dielectric and sidewalls of the isolation trench.

* * * * *